United States Patent
Buchanan et al.

(10) Patent No.: US 11,507,761 B2
(45) Date of Patent: Nov. 22, 2022

(54) PERFORMING COMPLEX MULTIPLY-ACCUMULATE OPERATIONS

(71) Applicant: Hewlett Packard Enterprise Development LP, Houston, TX (US)

(72) Inventors: Brent Buchanan, Palo Alto, CA (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 1156 days.

(21) Appl. No.: 16/072,279

(22) PCT Filed: Feb. 25, 2016

(86) PCT No.: PCT/US2016/019491
§ 371 (c)(1),
(2) Date: Jul. 24, 2018

(87) PCT Pub. No.: WO2017/146706
PCT Pub. Date: Aug. 31, 2017

(65) Prior Publication Data
US 2020/0167530 A1 May 28, 2020

(51) Int. Cl.
*G11C 7/10* (2006.01)
*G06G 7/163* (2006.01)
(Continued)

(52) U.S. Cl.
CPC ............ *G06G 7/163* (2013.01); *G05F 3/262* (2013.01); *G06N 3/0635* (2013.01);
(Continued)

(58) Field of Classification Search
CPC .......... G06G 7/163; G06G 7/16; G05F 3/262; G11C 13/0002; G11C 7/1006;
(Continued)

(56) References Cited

U.S. PATENT DOCUMENTS

| 5,128,674 A | 7/1992 | Kong et al. |
| 5,262,632 A | 11/1993 | Cam, Jr. et al. |

(Continued)

FOREIGN PATENT DOCUMENTS

| CN | 1248325 A | 3/2000 |
| CN | 1300945 A | 6/2001 |

(Continued)

OTHER PUBLICATIONS

Basiri, "An Efficient Hardware Based Mac Design in Digital Filters With Complex Numbers", (Research Paper), Proceedings for Signal Processing and Integrated Networks (SPIN), Feb. 20-21, 2014, pp. 475-480.

(Continued)

*Primary Examiner* — Michael T Tran
(74) *Attorney, Agent, or Firm* — Hewlett Packard Enterprise Patent Department

(57) ABSTRACT

In one example in accordance with the present disclosure a device is described. The device includes at least two memristive cells. Each memristive cell includes a memristive element to store one component of a complex weight value. The device also includes a real input multiplier coupled to the memristive element to multiply an output signal of the memristive element with a real component of an input signal. An imaginary input multiplier of the device is coupled to the memristive element to multiply the output signal of the memristive element with an imaginary component of the input signal.

14 Claims, 6 Drawing Sheets

(51) Int. Cl.
*G05F 3/26* (2006.01)
*G06N 3/063* (2006.01)
*G11C 11/54* (2006.01)
*G11C 13/00* (2006.01)
*H01L 43/08* (2006.01)

(52) U.S. Cl.
CPC ............ *G11C 7/1006* (2013.01); *G11C 11/54* (2013.01); *G11C 13/0069* (2013.01); *H01L 43/08* (2013.01)

(58) Field of Classification Search
CPC .. G11C 11/54; G11C 13/0069; G06N 3/0635; H01L 43/08
USPC .......................................... 708/835; 365/148
See application file for complete search history.

(56) References Cited

U.S. PATENT DOCUMENTS

| | | | |
|---|---|---|---|
| 5,917,447 A | 6/1999 | Wang et al. | |
| 6,826,587 B1 | 11/2004 | Montalvo et al. | |
| 7,072,929 B2 | 7/2006 | Pechanek et al. | |
| 8,687,432 B2* | 4/2014 | Hou | H01L 29/685 257/E21.667 |
| 9,548,741 B1* | 1/2017 | Kvatinsky | H03K 19/17708 |
| 10,528,643 B1* | 1/2020 | Choi | G11C 7/1006 |
| 10,748,609 B2* | 8/2020 | Naous | H03K 19/20 |
| 10,831,691 B1* | 11/2020 | Dazzi | G06F 13/4027 |
| 2006/0179273 A1 | 8/2006 | Cole et al. | |
| 2011/0184680 A1 | 7/2011 | Imaizumi et al. | |
| 2011/0292713 A1 | 12/2011 | Perner | |
| 2012/0011090 A1 | 1/2012 | Tang et al. | |
| 2013/0028004 A1 | 1/2013 | Snider | |
| 2013/0223132 A1 | 8/2013 | Perner | |
| 2014/0010023 A1 | 1/2014 | Park et al. | |
| 2014/0078809 A1* | 3/2014 | Katoh | H03K 3/0375 365/148 |
| 2014/0172937 A1 | 6/2014 | Linderman | |
| 2014/0181483 A1 | 6/2014 | O'Connor et al. | |
| 2014/0289179 A1* | 9/2014 | Di Castro | G06G 7/163 708/835 |
| 2014/0361851 A1 | 12/2014 | Keane et al. | |
| 2015/0098264 A1 | 4/2015 | Park | |
| 2016/0055907 A1* | 2/2016 | Buchanan | G11C 16/06 326/38 |
| 2016/0379695 A1* | 12/2016 | Kulkarni | G11C 11/1673 365/158 |
| 2017/0017877 A1* | 1/2017 | Kataeva | G06N 3/08 |
| 2017/0017879 A1* | 1/2017 | Kataeva | G06F 11/0721 |
| 2018/0350433 A1* | 12/2018 | Hu | G11C 5/05 |
| 2019/0026251 A1* | 1/2019 | Bekas | G11C 13/003 |
| 2020/0167530 A1* | 5/2020 | Buchanan | G06G 7/163 |

FOREIGN PATENT DOCUMENTS

| | | |
|---|---|---|
| CN | 1664595 A | 9/2005 |
| CN | 102053817 A | 5/2011 |
| CN | 102741805 A | 10/2012 |
| CN | 103345379 A | 10/2013 |
| DE | 19630435 C1 | 10/1997 |
| EP | 3286762 A1 | 2/2018 |
| JP | S57120177 A | 7/1982 |
| JP | H09294054 A | 11/1997 |
| WO | 2017/146706 A1 | 8/2017 |

OTHER PUBLICATIONS

International Search Report & Written Opinion received in PCT Application No. PCT/US2016/019491, dated Nov. 16, 2016, 10 pages.

Luo Yuan et al: "Archi tecture and implementation of a vector MAC unit for complex number", 9th International Conference on Communications and Networking in China, IEEE, Aug. 14, 2014, pp. 589-594, XP032742082, DOI: 10.1109/CHINACOM.2014. 7054364 [retrieved on Mar. 3, 2015].

Tranversa Fabio Lorenzo et al: "Universal Mamcomputing Machines", IEEE Transactions on Neural Networks and Learning Systems, IEEE, Picataway, NJ, USA, vol. 25, No. 11, Nov. 2, 2015 (Nov. 2, 2015), pp. 2702-2715, XP011587016, ISSN: 2182-237X, DOI: 10.1100/INNLS.2015.2031182 [retrieved on Oct. 18, 2015].

Extended European Search Report received for EP Patent Application No. 16891824.1, dated Mar. 15, 2018, 13 pages.

* cited by examiner

PERFORMING COMPLEX MULTIPLY-ACCUMULATE OPERATIONS

BACKGROUND

Memristive elements, such as memristors are devices that may be programmed to different states by applying electrical stimulus, for example, voltage or currents to the memristive elements. After programming, the state of the memristive elements may be read. The state of the memristive elements remain stable long enough to regard the device as non-volatile. A number of memristive elements may be included within an array in which a number of column lines intersect with a number of row lines, the memristive elements being located at the intersection of a column line and a row line.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings. Identical reference numbers designate similar, but not necessarily identical, elements.

DETAILED DESCRIPTION

Figure 1:
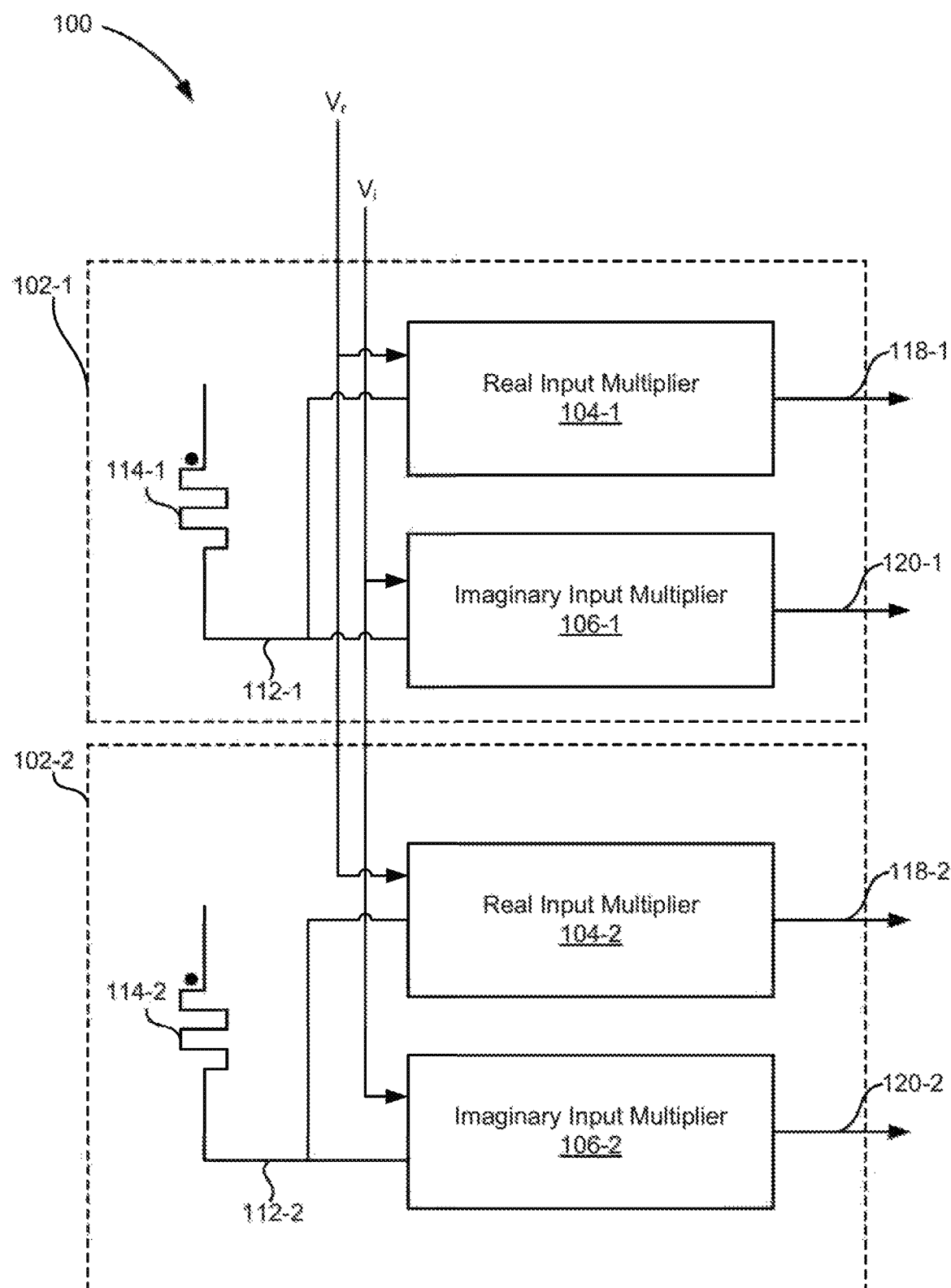
FIG. 1 is a diagram of a memristive multiplication device for performing a complex multiply-accumulate (MAC) operation, according to one example of the principles described herein.

Arrays of memristive elements such as memristors may be used in a variety of applications, including non-volatile solid state memory, programmable logic, signal processing, control systems, patter recognition, and other applications. The present application is directed to an array of memristive devices used to perform a multiply-accumulate (MAC) operation of, for example, a matrix of weight values and a number of input vector values. In other words, a memristive array can be used to perform vector-matrix or multiply-accumulate computations. An input voltage signal into the array is weighted by a resistance of the memristive elements, in columns and accumulated as the current output from each column.

Multiply-accumulate operations or dot-product operations are used in a number of applications. For example, given a received audio signal or a received video signal, a user may desire to filter, perform a Fast Fourier Transformation of the signal, or otherwise process an analog or digital signal. In these examples, a multiply-accumulate operation or dot product operation is used for performing such processing.

In another example, a series of arrays may form a neural network. Neural networks are computing networks that attempt to mimic a biological neural network such as a brain. A neural network may have adaptive weights i.e., weights that adjust based on a learning operation. Neural networks are also capable of approximating non-linear functions of an input. In a neural network, an input is received at one memristive array and processed, the output of this array is then fed into another array. This layering of memristive arrays is referred to as a neural network.

Given the wide use of MAC operations in discrete-time or discrete-space signal processing as well as in the expanding field of neural networking, the optimization of the MAC operation is desirable to increase the efficiency of digital signal processing and other processes that implement a MAC operation. In some examples, resistances of memristive elements in an array may be used as the matrix weight values that an input signal is to be multiplied by in a MAC operation. While the use of such arrays is indeed helpful in carrying out MAC operations that are used in many applications, some characteristics of the array limit their full use.

For example, in performing signal filtering, or other MAC-related operation, weights, inputs, and outputs may include complex values that include a real component and an imaginary component. In one specific example, the weights in a Discrete Time Fourier Transform (DTFT) are complex, i.e., the sampled values are of the form of the unity-magnitude complex exponential $e^{-j\omega t}$ for some fixed frequency $\omega$. While negative value weights enable the constructive and destructive summation of a signal with its MAC kernel, complex weights further enable accurate detection and manipulation of frequency phases.

In a neural network, while an initial input may include just real components, when that input is multiplied by a complex weight value, the output is also complex, which complex output may become a complex input to another memristive array.

A complex input can be represented in Cartesian representation as $a+jb$ where j equals the square root of negative one. A complex weight can also be represented in Cartesian representation as $c+jd$. The multiplication of the complex input with the complex weight can also be represented in a Cartesian system as $(ac-bd)+j(ad+bc)$. As can be seen from this representation, each component of the weight, c and d, are used twice and each component of the input signal, a and b, are also used twice in calculating a dot product of complex inputs and complex weights. Accordingly, when doing MAC operations using complex inputs, a system should allow for each weight value to be used twice in each layer of computation.

Two approaches have been presented to accommodate the duplicated use of these weight values. In one approach, two memristive elements are used to indicate a single component, c, and two memristive elements are used to indicate the other component, d. However, doing so is impractical as it is difficult to replicate memristive element resistances such that there would be an error value between the memristive elements that represents a component c, and an error value between the memristive elements that represents a component d.

In another approach, a multiply operation is performed on a single memristive element two times. For example, one multiplication operation is executed to yield an output that corresponds to a real component of the output, i.e., ac, that value is stored, and then the same memristive element is used again to perform a second operation to yield an output that corresponds to the imaginary component of the output, be. However, doing so increases the latency of any MAC operation as two operations are performed.

Accordingly, the present specification describes a device for performing a MAC operation on complex inputs and complex weights. Specifically, the present specification describes a device and method of performing the sub-computations of a complex MAC operation at the same time all while using a single memristive element for each component. In other words, a single memristive element is used to represent component c, and a single memristive element is used to represent component d of the complex weight value. Both multiplications of one component of the weight value, for example, c, are performed in parallel. Similarly, both multiplication operations of the other component, d, are performed in parallel to one another, and also in parallel to the multiplication of the c components. Doing so allows for fast, real-time, complex-valued filter or neural network operation.

More specifically, the present specification describes a memristive multiplication device. The device includes at least two memristive cells. Each memristive cell includes a memristive element to store one component of a complex weight value. Each memristive cell also includes a real input multiplier coupled to the memristive element to multiply an output signal of the memristive element with a real component of an input signal. The device further includes an imaginary input multiplier coupled to the memristive element to multiply the output signal of the memristive element with an imaginary component of the input signal.

The present specification also describes a method for performing a complex multiply accumulate operation. According to the method, a first voltage representing a real component of an input signal and a second voltage representing an imaginary component of the input signal are applied to a real input multiplier and an imaginary input multiplier, respectively, of a first memristive cell. Similarly, the first voltage and the second voltage are applied to a real input multiplier and an imaginary input multiplier, respectively, of a second memristive cell. A first current, representing a real component of a complex weight input, is applied to the real input multiplier and imaginary input multiplier of the first memristive cell and a second current, representing an imaginary component of a complex weight input, is applied to the real input multiplier and the imaginary input multiplier of the second memristive cell. The outputs of multipliers that include real components are collected and summed and the outputs of multipliers that include imaginary components are also collected and summed, the summations when viewed together represent a multiply-accumulate operation of a complex input and a complex weight value.

The present specification also describes a memristive array. The array includes multiple memristive multiplication devices. Each memristive multiplication device includes a first memristive cell that includes a memristive element to store a real component of a complex weight value and a second memristive cell that includes a memristive element to store an imaginary component of the complex weight value. Each of the memristive cells also include a real input multiplier coupled to the memristive element to 1) receive an output signal of the memristive element, 2) receive a real component of an input signal, and 3) output a signal defining a multiplication of the output signal with the real component. Each of the memristive cells also include an imaginary input multiplier coupled to the memristive element to 1) receive an output signal of the memristive element, 2) receive an imaginary component of an input signal, and 3) output a signal defining a multiplication of the output signal with the imaginary component. The array also includes a real summation device to sum outputs having real components and an imaginary summation device to sum outputs having imaginary components.

Using single memristive devices to represent real and imaginary components of a complex weight and using real input multipliers and imaginary input multipliers 1) allows for a single memristive device to store the value of each element of the complex weights and 2) performs sub-computations of complex multiplication simultaneously, thus increasing efficiency of complex MAC operations. However, it is contemplated that the devices disclosed herein may provide useful in addressing other matters and deficiencies in a number of technical areas. Therefore the systems and methods disclosed herein should not be construed as addressing any of the particular matters.

As used in the present specification and in the appended claims, the term "memristive element" may refer to a passive two-terminal circuit element that maintains a functional relationship between the time integral of current, and/or the time integral of voltage.

Still further, as used in the present specification and in the appended claims, the term "multiply-accumulate operation" is meant to be understood broadly as the product of two vectors to form a scalar. In one example, the vectors may be represented as matrices that may be multiplied. Other names for a multiply-accumulate operation include dot product, scalar product, and inner product. A complex MAC operation refers to a MAC operation that involves at least one of a complex input signal and a complex weight value.

Accordingly, as used in the present specification and in the appended claims, the term 'complex' such as a complex weight or a complex input, refers to a number that can be expressed in the form a+jb where a is the real component and b is the imaginary component of the complex number.

Still further, as used in the present specification and in the appended claims, the term "weight" may refer to the matrix of coefficients used in performing a MAC operation. Accordingly, a weight value refers to an individual coefficient within the matrix. Each coefficient of the weight may be indicated by a particular memristive element in an array.

Still further, as used in the present specification and in the appended claims, the term "real input multiplier" refers to a component of a cell that multiplies an output signal of a memristive element (which output signal is indicative of a real component of a weight or an imaginary component of a weight) with a real component of an input signal. Note that the output of a real input multiplier may be either real or imaginary. For example, a real component, a, of the input signal multiplied by an imaginary component, d, of a weight, results in an imaginary output, ad. By comparison, the real component, a, of the input signal multiplied by a real component, c, of a weight, results in a real output, ac.

By comparison, as used in the present specification and in the appended claims, the term "imaginary input multiplier" refers to a component of the cell that multiplies an output signal of a memristive element (which output signal is indicative of a real component of a weight or an imaginary component of a weight) with an imaginary component of an input signal. Note that the output of an imaginary input multiplier may be either real or imaginary. For example, an imaginary component, b, of the input signal multiplied by an imaginary component, d, of a weight, results in a real output, −bd. By comparison, the imaginary component, b, of the input signal multiplied by a real component, c, results in an imaginary output, bc.

Even further, as used in the present specification and in the appended claims the term "real weight cell" refers a cell with a memristive element that represents a real component of a weight.

Yet further, as used in the present specification and in the appended claims, the term "imaginary weight cell" refers to a cell with a memristive element that represents an imaginary component of a weight.

Even further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Turning now to the figures, FIG. 1 is a diagram of a memristive multiplication device (100) for performing a complex MAC operation, according to one example of the principles described herein. The memristive multiplication device (100) includes at least two memristive cells (102-1, 102-2). As used in the present specification, the indicator "-*" refers to a specific instance of an element. For example, a first memristive cell is referenced as (102-1). The absence of the indicator "-*" refers to the element in general. For example, a generic memristive cell is referenced as (102).

Each memristive cell (102) carries out multiplication of an input signal (both the real and imaginary component) with either an imaginary or real component of the weight value. Accordingly, a memristive cell (102) may be a real weight cell or an imaginary weight cell. The terms "real weight cell" and "imaginary weight cell" refer to the type of component of a complex weight value that is multiplied in that memristive cell (102). For example, a memristive element (114-1) in a real weight cell, such as the first memristive cell (102-1) indicates a real component of a complex weight value and an output (112-1) of the first memristive element (114-1) is a current indicative of the real component of the complex weight value. By comparison, a memristive element (114-2) in an imaginary weight cell, such as the second memristive cell (102-2) indicates an imaginary component of a complex weight value and an output (112-2) of the second memristive element (114-2) is a current indicative of the imaginary component of the complex weight value.

As each memristive cell (102-1, 102-2) is used to represent the multiplication of complex weight values, each memristive cell (102) includes a memristive element (114-1, 114-2) that stores one component of the complex weight value. Specifically, a first memristive element (114-1) may store a real component of the complex weight such that the output (112-1) of the first memristive element (114-1) is a current indicative of the real component of the complex weight and the second memristive element (114-2) stores an imaginary component of the complex weight such that the output (112-2) of the second memristive element (114-2) is a current indicative of the imaginary component of the complex weight.

More specifically, a memristive element (114) Is used to store information. A memristive element (114) stores information based on a resistance level of the memristive element (114), each level corresponding to a state of the memristive device (114). While specific reference is made to discrete resistance levels, in some examples, for example an analog system, the memristive element (114) may have a continuum of values between a minimum and maximum value. By switching between resistance states, the memristive device (114) therefore represents multiple logic values, or analog values, and stores multiple bits of information. Put another way, the memristive element (114) can be used to represent a number of bits of data. For example, a memristive element (114) in a first resistance state may represent a logic value of "1". The same memristive element (114) in a second resistance state may represent a logic value of 0'. Still further the same memristive element (1140 may represent intermediate resistance values corresponding to analog values. As the memristive element (114) is capable of having multiple resistance states, the memristive element (114) is also capable of representing more than just two (i.e., 0 and 1) logical values or analog values. Each logic value, or analog value is associated with a resistance state of the memristive element (114) such that data can be stored in a memristive element (114) by changing the resistance state of the memristive element (114). This may be done by applying a voltage potential across a target memristive element (114) by passing voltages to interconnect fines that correspond to the target memristive element (114). While specific mention s made of memristive elements (114) representing two logic values, i.e., a binary memristive element (114), a memristive element (114) can have any number of resistance states and therefore can represent any number of logic values. For example a memristive element (114) can have three, four, or even more resistance states.

A memristive element (114) changes resistance by transporting dopants within a switching layer to increase or decrease the resistivity of the memristive element (114). As a sufficient voltage is passed across the memristive element (114) the dopants become active such that they move within a switching layer of the memristive element (114) and thereby change the resistance of the memristive element (114).

A memristive element (114) is non-volatile because the memristive element (114) maintains its resistance. In this manner, the memristive element (114) are "memory resistors" in that they "remember" the last resistance that they had. Put another way, if charge flows in one direction through a memristive element (114), the resistance of that component of the circuit will increase. If charge flows in the opposite direction in the memristive element (114), the resistance will decrease. If the flow of charge is stopped by turning off the applied voltage, the memristive element (114) will "remember" the last resistance that it had, and when the flow of charge starts again the resistance of the memristive element (114) will be what it was when it was last active.

Memristive elements (114) take many forms. One example is a metal-insulator-metal structure where the memristive elements (114) include a first conductive electrode a second conductive electrode and a switching element placed between the conductive electrodes. The first and second conductive electrodes may be formed of an electrically conductive material such as AlCu, AlCuSi, TaAl, TiN, HfN, AlN, Pt, Cu, and WSiN. In some examples the first and second electrode are formed of the same material, and in other examples the second electrode is formed of a different material than the first electrode. In some examples, the first conductive electrode and the second conductive electrode may be referred to as a top electrode and a bottom electrode. In the figures, the top electrode is indicated with a dot.

The switching element may be formed of a switching oxide, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc. The memristive elements (114) may be fabricated through any other reasonably suitable fabrication process, such as, for example, chemical vapor deposition, sputtering, etching, lithography, or other methods of forming memristive elements (114).

The memristive elements (114) may be built at the micro- or nano-scale and used as a component in a wide variety of electronic circuits, such as, bases for memories and logic circuits. When used as a logic circuit, as described herein, the memristive elements (114) may be employed to represent bits in a field programmable gate array, as the basis for a wired-logic programmable logic array, or as a dot product engine. The memristive elements (114) disclosed herein may also find use in a wide variety of other applications. While specific reference is made to binary memristive elements (114), the memristive elements (114) may be set to more than two resistance states and thereby capable of storing more than two logic values. Still further, the memristive elements (114) may be used to represent analog values The state of the memristive elements (114) may be changed in response to various programming conditions and the memristive element (114) is able to exhibit a memory of past electrical conditions. For instance, the memristive element (114) may be programmed to have one of a plurality of distinct states. Particularly, the conductance level of the switching element may be changed through application of an electrical field, e.g., through application of a current or voltage, in which the current or voltage may cause mobile dopants in the switching element to move and/or change the status of conducting channel(s) in the switching element, which may alter the resulting electrical operation of the memristive element (114). That is, for instance, the distinct conductance levels of the switching element, and thus the state of the memristive element (114), may correspond to different programming current levels or voltage amplitudes applied to the switching element.

By way of example, the switching element may be programmed to have a higher conductance level through application of an earlier current or voltage level. After removal of the current or voltage, the locations and characteristics of the dopants or conducting channels are to remain stable until the application of another programming electrical field. That is, the switching element remains at the programmed conductance level following removal of the current or voltage. While specific reference is made to memristive elements (114), other resistive memory elements may be used also. Other examples of resistive memory elements include resistive random-access memory (RRAM) elements, phase-change random-access memory (PCRAM), and magnetoresistive random-access memory (MRAM).

The memristive elements (114) can be used in matrix multiplication. For example, an input vector signal, is passed to the multipliers (104, 106) of the memristive cells (102). The input signal may be in a form (i.e., a voltage or a current) that is representative of a signal, such as an audio signal, a video signal, or other analog or digital signal, that is to be filtered, transformed, convoluted, or otherwise processed by a matrix of values, which matrix of values are represented by the resistances of the number of memristive elements (114). The input signals interact with the outputs (112) of the memristive elements (114) to generate outputs (118-1, 118-2, 120-1, 120-2) that represent the multiplication of the corresponding input components and the output (112) of the memristive elements (114). The memristive elements (114) may be set to any number of resistance levels. Distinct resistance levels may be used to represent, distinct coefficients of real and imaginary components of weight values.

To carry out the multiplication of the components of the complex weight with both components of an input signal, i.e., (a+jb)(c+jd), each memristive cell (102) includes two input multipliers. Specifically a real input multiplier (104) multiplies an output (112) of the memristive element (114), which output is representative of a component of the weight, with a real component of the input signal, which real component, a, of the input signal is represented by a voltage, $V_r$. Similarly, an imaginary input multiplier (106) multiplies the output (112) of the memristive element (114), with an imaginary component, b, of the input signal, which imaginary component of the input signal which is represented by a voltage $V_i$.

The memristive multiplication device (100) described herein allows for the simultaneous execution of sub-computations of the complex MAC operation without having to either 1) re-use a memristive element (114) multiple times for a particular operation or 2) replicate a memristive element (114) to represent a component of a complex weight two times. A specific example of a complex MAC operation is given below in connection with FIG. 3.

Figure 2:
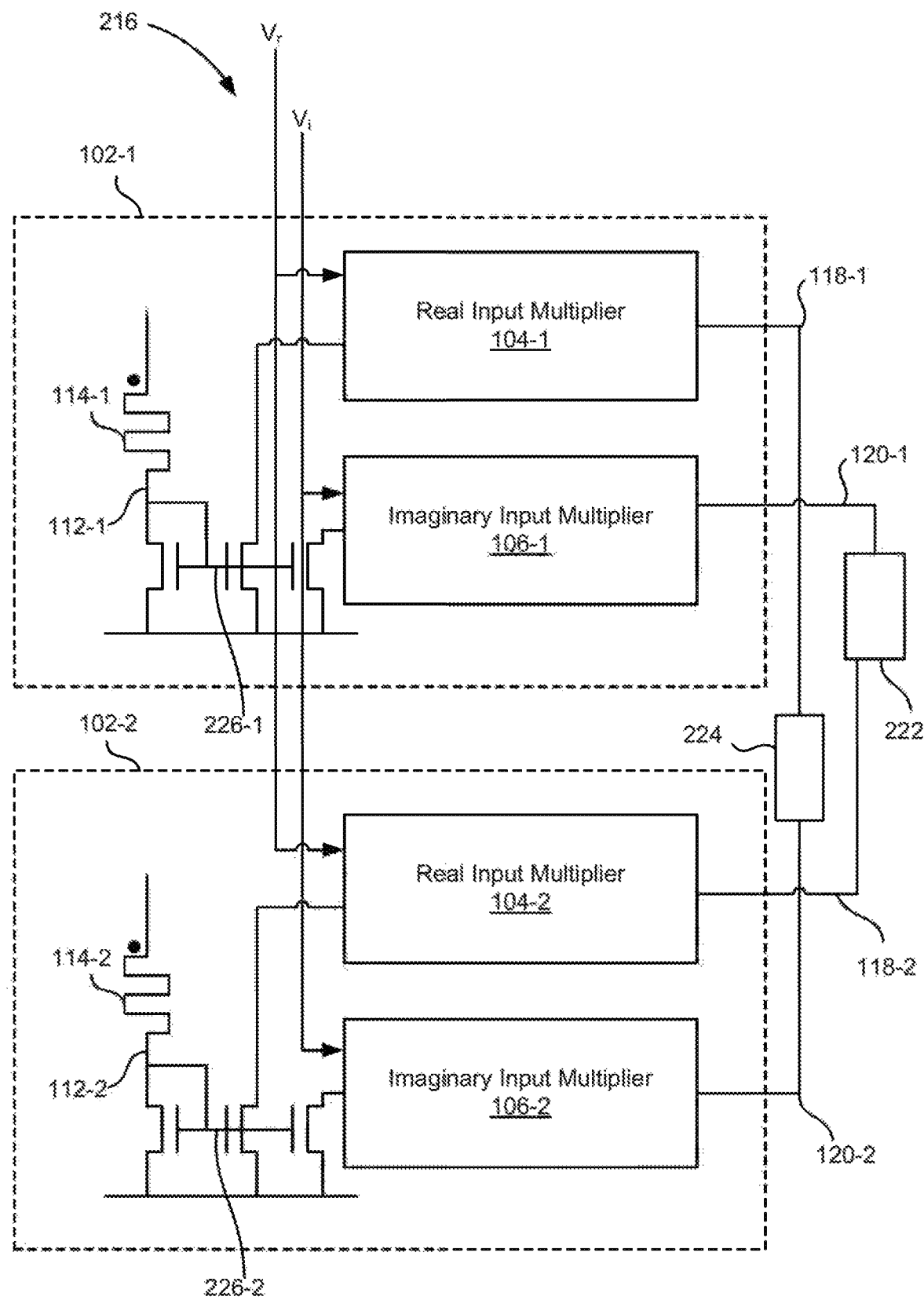
FIG. 2 is a diagram of a system for performing a complex multiply-accumulate (MAC) operation, according to one example of the principles described herein.

FIG. 2 is a diagram of a memristive system (216) for performing a complex multiply-accumulate (MAC) operation, according to one example of the principles described herein. The system (216) includes at least one memristive multiplication device (FIG. 1, 100), each device (FIG. 1, 100) including multiple memristive cells (102).

A first memristive cell (102-1) includes a memristive element (114-1) to store a real component of a complex weight value and as such may be referred to as a real weight cell. The second memristive cell (102-2) includes a memristive element (114-2) to store an imaginary component of a complex weight value and as such may be referred to as an imaginary weight cell. As described above the real and imaginary components of the complex weight value may be stored as resistances of the respective memristive elements (114-1, 114-2).

Each memristive cell (102) includes a real input multiplier (104) that 1) receives an output signal (112) of the memristive element (114), 2) receives a real component, a, of an input signal, and 3) outputs a signal (118) defining a multiplication of the output signal (112) with the real component. Each memristive weight cell (102) also includes an imaginary input multiplier (106) that 1) receives an output signal (112) of the memristive element (114), 2) receives an imaginary component, b, of an input signal, and 3) outputs a signal (120) defining a multiplication of the output signal (112) with the imaginary component.

Specifically, a first memristive element (114-1) has a resistance that represents one component, for example, a real component, g, of a weight value. An output (112-1) of the first memristive element (114-1) is a current that is duplicated to both the first real input multiplier (104-1) and the first imaginary input multiplier (106-1) and that represents the resistance of the first memristive element (114-1). Similarly, a second memristive element (114-2) has a resistance that represents another component, for example, an imaginary component, d, of a weight value. An output (112-2) of the second memristive element (114-2) is a current that is duplicated to both a second real input multiplier (104-2) and a second imaginary input multiplier (106-2) and that represents the resistance of the second memristive element (114-2). To duplicate the output (112) of the memristive element (114), each memristive cell (102) includes a multi-output current mirror (226-1, 226-2), or a similar component, to duplicate the output of the memristive element (114) to both the real input multiplier (104) and the imaginary input multiplier (106).

Both real input multipliers (104-1, 104-2) receive a voltage, $V_r$, representing a real component, a, of an input signal, and carry out an operation that simulates the multiplication of the respective output signals (112-1, 112-2) with the real component. Each real input multiplier (104-1, 104-2) accordingly generates an output (118-1, 118-2) respectively that defines a multiplication of the respective output signal (112-1, 112-2) with the real component, a, of the input. Note that the output of (118) a particular real input multiplier (104) may be either real or imaginary. For example, in the first real input multiplier (104-1), a real component, a, of the input multiplied by a real component, c, of a weight, results in a real output (118-1), ac. By comparison, in the second real input multiplier (104-2), the real component, a of the input signal, multiplied by an imaginary component, d, of a weight, results in an imaginary output (118-2), ad.

Similarly, both imaginary input multipliers (106-1, 106-2) receive a voltage, $V_i$, representing an imaginary component, b, of an input signal, and carry out an operation that simulates the multiplication of the respective output signals (112-1, 112-2) with the imaginary component, b. Each imaginary input multiplier (106-1, 106-2) then generates an output (120-1, 120-2) respectively that defines a multiplication of the respective output signal (112-1, 112-2) with the imaginary component, b, of the input. Note that the output (120) of a particular imaginary input multiplier (106) may be either real or imaginary. For example, in the second imaginary multiplier (106-2), an imaginary component, b, of the input multiplied by an imaginary component, d, of a weight, results in a real output (120-2), −bd. By comparison, in the first imaginary input multiplier (106-1), an imaginary component, b, of the input multiplied by a real component, c, of a weight, results in an imaginary output (120-1), bc.

The system (216) also includes a real summation device (224) and an imaginary summation device (222). The real summation device (224) then sums outputs (118-1, 120-2) of multipliers (104, 106) that include just real components and the imaginary summation device (222) sums outputs (120-1, 118-2) that includes just imaginary components. The outputs that include just real components may come from different types of multipliers (104, 106) from the different memristive cells (102). If the multipliers (104, 106) are implemented as described below and in FIG. 48, then these outputs (118-1, 120-2) are in the form of currents. As currents can be summed on a single node, the real summation device (224) may be a wire.

For example, an output (118-1) of the first real input multiplier (104-1) of a real weight cell—which is an output representing the multiplication of real component, a, of the input signal combined with a real weight component c,—represents a real output component ac. Similarly, an output (120-2) of the second imaginary input multiplier (106-2) of an imaginary weight cell—which is an output representing the multiplication of an imaginary component, b, of the input signal, combined with an imaginary weight component d,—represents a real output component −bd. Accordingly the real summation device (224) output can be defined as ac−bd, which may for ease of reference be re-termed e.

Similarly, an imaginary summation device (222) then sums outputs (118-2, 120-1) of multipliers (104, 106) that include just imaginary components. The outputs that include just imaginary components may come from different types of multipliers (104, 106) from the different memristive cells (102). If the multipliers (104, 106) are implemented as described below and in FIG. 46, then these outputs (118-2, 120-1) are in the form of currents. As currents can be summed on a single node, the imaginary summation device (222) may be simply a wire.

For example, an output (118-2) of the first imaginary input multiplier (104-2) of a real weight cell—which is an output representing the multiplication of an imaginary component b of the input signal combined with a real weight component c,—represents an imaginary output component bc. Similarly, an output (120-1) of the second real input multiplier (104-2) of an imaginary weight cell—which is an output representing the multiplication of a real component a of the input signal combined with an imaginary weight component d,—represents a real output component ad. Accordingly the imaginary summation device (222) output can be defined as ad+bc, which may for ease of reference be re-termed f. The combined sums, a+jf represent the complex MAC operation performed on the complex input and the complex weight value.

Figure 3:
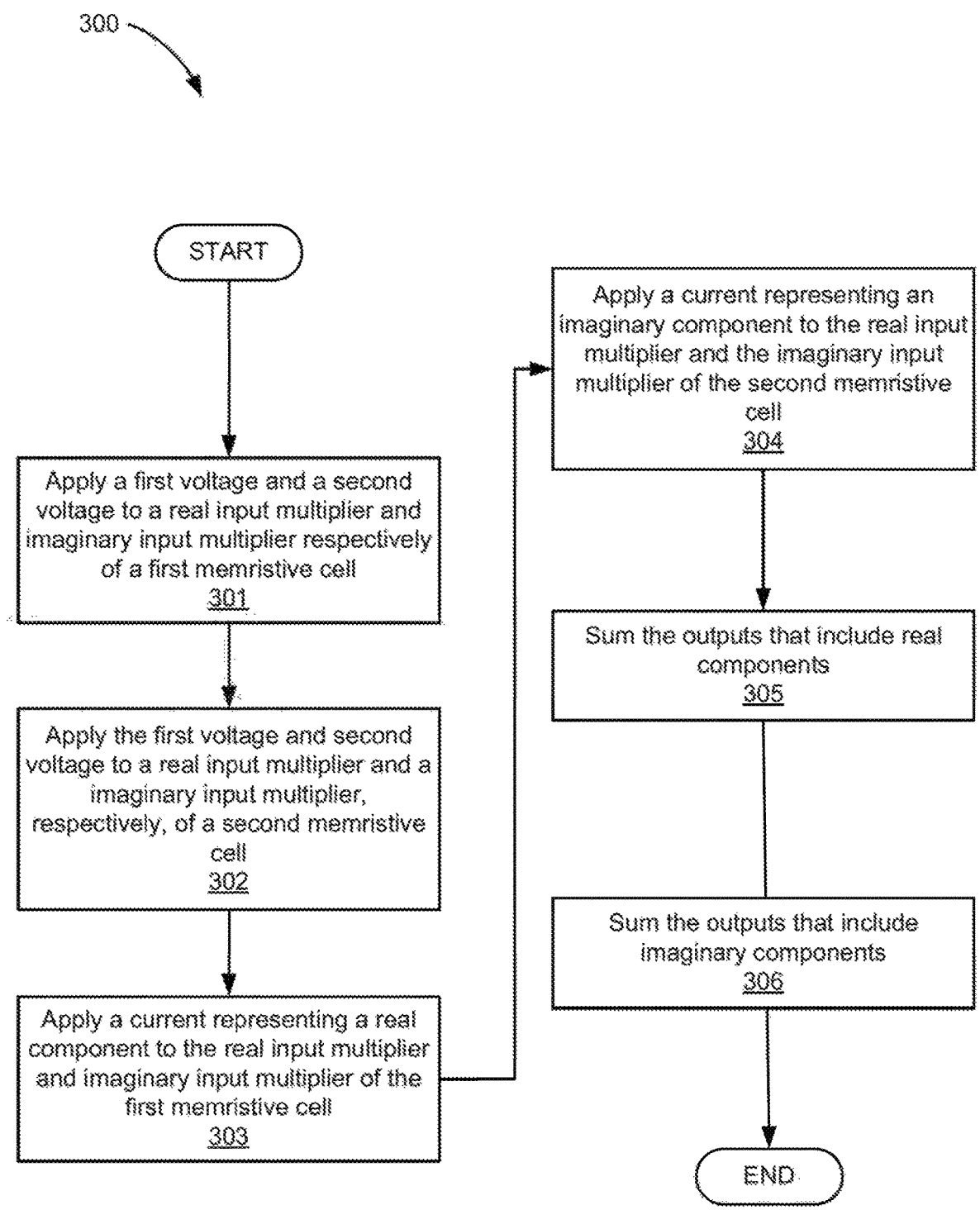
FIG. 3 is a flowchart of a method for performing a complex multiply-accumulate operation, according to one example of the principles described herein.

FIG. 3 is a flowchart of a method (300) for performing a complex multiply-accumulate operation, according to one example of the principles described herein. According to the method (300), a first voltage, $V_r$, representing a real component, a, of an input signal and a second voltage, $V_i$, representing an imaginary component, b, of the input signal are applied (block 301) to a first real input multiplier (FIG. 1, 104-1) and a first imaginary input multiplier (FIG. 1, 106-1), respectively, of a first memristive cell (FIG. 1, 102-1). The first memristive cell (FIG. 1, 102-1) may be a real weight cell meaning it executes an operation that represents a multiplication of the input signal with a real component, c, of the weight.

The first voltage, $V_r$, and the second voltage $V_i$, are also applied (block 302) to a second real input multiplier (FIG. 1, 104-2) and a second imaginary input multiplier (FIG. 1, 106-2), respectively of a second memristive cell (FIG. 1, 102-2). The second memristive cell (FIG. 1, 102-2) may be an imaginary weight cell meaning it executes an operation that represents a multiplication of the input signal with an imaginary component, d, of the weight. As described above, the input vector is representative of a signal, such as an audio or video signal to be filtered, transformed, convoluted or otherwise processed via a matrix multiplication operation. The input voltages interact with the multipliers (FIG. 1, 104, 106) and the resulting current is collected and summed.

Accordingly, the first voltage and the second voltage may be representative of a single complex value in a complex input vector, with different complex values of the complex vector being applied to different multiplication devices (FIG. 1, 100).

A current representing a real component, c, of a complex weight is applied (block 303) to the real input multiplier (FIG. 1, 104-1) and the imaginary input multiplier (FIG. 1, 106-1) of the first memristive cell (FIG. 1, 102-1). This current is applied to the input multipliers (FIG. 1, 104-1, 106-1) by passing a reading voltage $V_{read}$, through the first memristive element (FIG. 1, 114-1) which first memristive element (FIG. 1, 114-1) has a resistance defining the real component, c. Note that the method (300) may also include applying a voltage to the memristive elements (FIG. 1, 114) to program the state of the memristive elements (FIG. 1, 114) to represent a component of the complex weight value. This may be done as described above by passing a voltage having a certain value through the memristive element (FIG. 1, 114) so as to initiate dopant movement.

$V_{read}$ may be a maximum voltage that will not disturb the memristive element (FIG. 1, 114). For example, a memristive element (FIG. 1, 114) has a switching voltage which initiates a change of state of the memristive element (FIG. 1, 114). In this example, $V_{read}$ may be below that switching voltage. Doing so allows an enhanced signal-to-noise ratio for the resulting current.

Applying (block 303) this current to both the real input multiplier (FIG. 1, 104-1) and the imaginary input multiplier (FIG. 1, 106-1) of the first memristive cell (FIG. 1, 102-1) includes duplicating the current such that an instance of the current is passed to the real input multiplier (FIG. 1, 104-1) and the imaginary input multiplier (FIG. 1, 106-1) of the first memristive cell (FIG. 1, 102-1). The duplication can be carried out by the current mirror (FIG. 2, 226-1).

Each multiplier (FIG. 1, 104-1, 106-1) of the first memristive cell (FIG. 1, 102-1) then executes an operation that defines a multiplication of the real component c, of the weight with the real component, a, and the imaginary component, b, respectively of the input signal. More specifically, an output (FIG. 1, 118-1) of the first real input multiplier (FIG. 1, 104-1) is a signal that may be defined as ac. An output (FIG. 1, 120-1) of the first imaginary input multiplier (FIG. 1, 106-1) is a signal that may be defined as bc. Note that since a and c are real components and b is an imaginary component, ac is a real component of an output of the first memristive cell (FIG. 1, 102-1) and bc is an imaginary component of an output of the first memristive cell (FIG. 1, 102-1).

A current representing an imaginary component, d, of a complex weight is applied (block 304) to the real input multiplier (FIG. 1, 104-2) and the imaginary input multiplier (FIG. 1, 106-2) of the second memristive cell (FIG. 1, 102-2). This current is applied to the input multipliers (FIG. 1, 104-2, 106-2) by passing the reading voltage, $V_{read}$ through the second memristive element (FIG. 1, 114-2) which second memristive element (FIG. 114-2) has a resistance defining the imaginary component d.

Applying (block 304) this current to both the real input multiplier (FIG. 1, 104-2) and the imaginary input multiplier (FIG. 1, 106-2) includes duplicating the current such that an instance of the current is passed to the real input multiplier (FIG. 1, 104-2) and the imaginary input multiplier (FIG. 1, 106-2) of the second memristive cell (FIG. 1, 102-2). The duplication can be carried out by the current mirror (FIG. 2, 226-2).

Each multiplier (FIG. 1, 104-2, 106-2) of the second memristive cell (FIG. 1, 102-2) then executes an operation that defines a multiplication of the imaginary component, d, of the weight with the real component, a, and the imaginary component, b, of the input signal. More specifically, an output (FIG. 1, 118-2) of the second real input multiplier (FIG. 1, 104-2) is a signal that may be defined as ad. An output (FIG. 1, 120-2) of the second imaginary input multiplier (FIG. 1, 106-2) may be defined as −bd. Note that since a is a real component and b and d are imaginary components, ad is an imaginary component of an output of the second memristive cell (FIG. 1, 102-2) and −bd is a real component of an output of the second memristive cell (FIG. 1, 102-2).

In some examples, the multipliers (FIG. 1,104, 106) may execute operations simultaneously. As such, the sub-computations of a complex multiplication are performed in parallel thus reducing the amount of time used to compute a complex MAC operation.

The outputs of the multipliers (FIG. 1, 104, 106) that contain just real components may then be summed (block 305) and outputs of multipliers (FIG. 1, 104, 106) that contain just imaginary components are then summed (block 306). Returning to the example, as the output (FIG. 1, 118-1) of the first real input multiplier (FIG. 1,104-1), ac, contains just real components and the output (FIG. 1, 120-2) of the second imaginary input multiplier (FIG. 1, 106-2), −bd, contains just real components, the real summation device (FIG. 2, 224) sums (block 305) these components, which summation may be defined as ac−bd. Similarly, the output (FIG. 1, 120-1) of the first imaginary input multiplier (FIG. 1, 106-1), bc, and the output (FIG. 1, 118-2) of the second real input multiplier (FIG. 1, 104-2) ad, contain imaginary components, the imaginary summation device (FIG. 2, 222) sums (block 306) these components, which summation may be defined as ad+bc.

Thus, as can be seen the method (300) allows for the simultaneous calculation of the real component of an output, ac−bd, and the imaginary component of the output ad+bc, without having to use multiple memristive devices to represent a single component of the weight and that also does not necessitate the use of a memristive device multiple times in a single MAC operation.

Figure 4A:
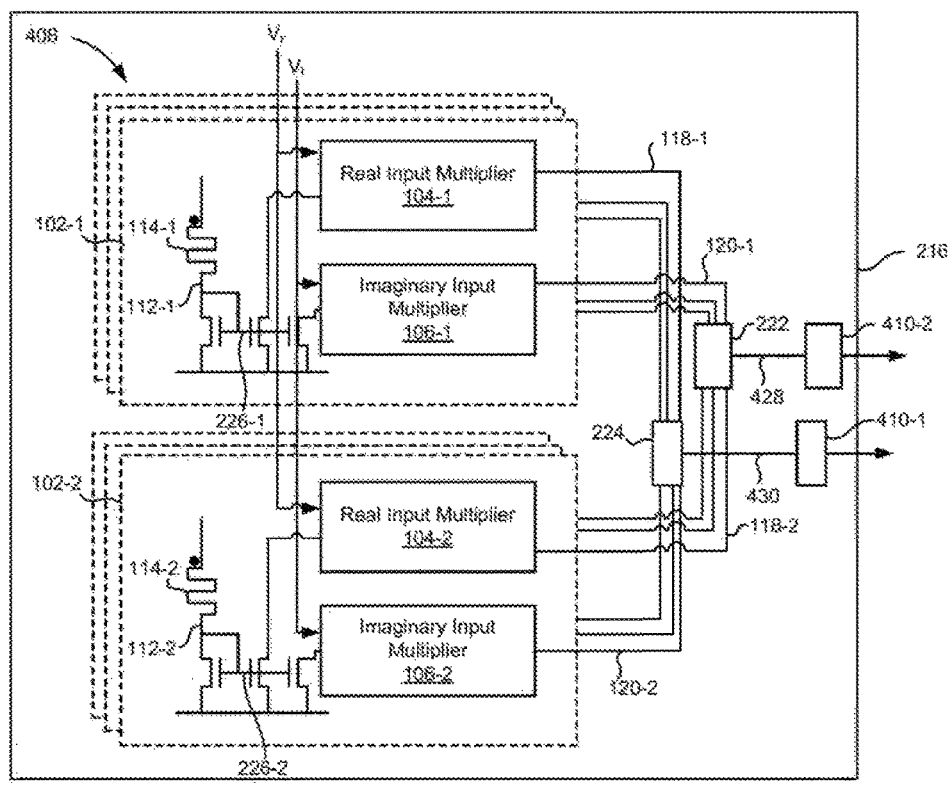
FIG. 4A is a diagram of a system for performing a complex multiply-accumulate (MAC) operation, according to another example of the principles described herein.

FIG. 4A is a diagram of a memristive system (216) for performing a complex multiply-accumulate (MAC) operation, according to another example of the principles described herein. As described above, in some examples, each input value received at a particular memristive multiplication device (FIG. 1, 100) may be an individual value of a complex input vector with different devices receiving different complex values form the complex vector. Accordingly, the system (216) may include an array (408) of multiplication devices (FIG. 1, 100), each device (FIG. 1, 100) having first memristive cells (102-1) and second memristive cells (102-2). Again for simplicity, a dashed box indicating an individual multiplication device (FIG. 1, 100) is omitted for simplicity, but an individual multiplication device (FIG. 1,100) is formed by two memristive cells (102-1, 102-2). Similarly for simplicity, within the array (408) just one instance each of the first memristive cell (102-1) and the second memristive cell (102-2) is identified with a reference number, however the array (408) includes multiple devices (FIG. 1, 100) each having an instance of a first memristive cell (102-1) and a second memristive cell (102-2).

In the system (216), the real summation device (224) sums the real outputs (118-1, 120-2) from multiple memristive multiplication devices (FIG. 1, 100). For example, the outputs (118-1) of real input multipliers (104-1) of multiple first memristive cells (102-1) are summed with the outputs (120-2) of imaginary input multipliers (106-2) of multiple second memristive cells (102-2). For simplicity a single instance of these outputs (118-1, 120-2) are indicated with a reference number. An output (430) of the real summation device (224) may be a single output. This single output (430) defines the summation of the real outputs of the multiple memristive multiplication devices (FIG. 1, 100). If the multipliers (104, 106) are implemented as described below and in FIG. 4B, then these outputs (118-2, 120-1) are in the form of currents. As currents can be summed on a single node, the imaginary summation device (222) may be a wire.

Similarly, the imaginary summation device (222) sums the imaginary outputs (118-2, 120-1) from multiple memristive multiplication devices (FIG. 1, 100). For example, the outputs (118-2) of real input multipliers (104-2) of multiple second memristive cells (102-2) are summed with the outputs (120-1) of imaginary input multipliers (106-1) of multiple first memristive cells (102-1). For simplicity, a single instance of these outputs (118-2, 120-1) are indicated with a reference number. An output (428) of the imaginary summation device (222) may be a single output. This single output (428) defines the summation of the imaginary outputs of the multiple memristive multiplication devices (FIG. 1, 100). If the multipliers (104, 106) are implemented as described below and in FIG. 4B, then these outputs (118-2, 120-1) are in the form of currents. As currents can be summed on a single node, the imaginary summation device (222) may be a wire.

The system (216) may include a first analog-to-digital converter (410-1) to convert an output (430) of the real summation device (224) Into a digital signal. The system (216) may also include a second analog-to-digital converter (410-2) to convert an output (428) of the imaginary summation device (222) into a digital signal. These outputs may then be fed into subsequent memristive arrays, for example in a neural network.

Figure 4B:
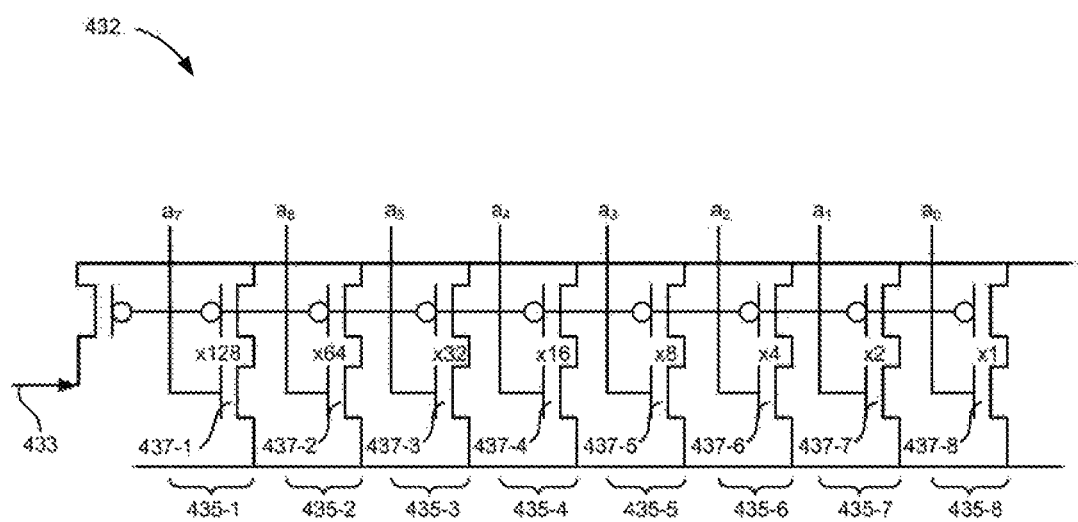
FIG. 4B is a diagram of an input multiplier, according to one example of the principles described herein.

The multipliers (104, 106) of the system (216) may take many forms. For example, as depicted in FIG. 4B, each input multiplier (104, 106) may be a multiplying digital-to-analog converter (MDAC) (432). The MDAC (432) is a multi-output current mirror that receives a current (433), i.e., a current representing a weight component of a matrix and executes an operation that replicates a multiplication of that weight component with an input word. In FIG. 4B, the input word is made up of bit values $a_0$, $a_1$, $a_2$, $a_3$, $a_4$, $a_5$, $a_6$, and $a_7$, indicating the input word is a real component.

Each output branch (435-1, 435-2, 435-3, 435-4, 435-5, 435-6, 435-7, 436-8) of the current mirror outputs a weighted copy of the input current (433) when that branch (435) is enabled by that branch's series switch, which series switch is represented by an n-type field effect transistor (NFET) (437-1, 437-2, 437-3, 437-4, 437-5, 437-6, 437-7, 437-8). For example one branch (4358) may output 1× the input current (433), another branch (435-7) may output 2× the input current (433), another branch (435-6) may output 4× the input current (433), and so on, such that with eight branches (435), the outputs of 1×, 2×, 4×, 8×, 16×, 32×, 64×, and 128× the input current (433) are available. All branches (435) are tied to a single output node, such that when multiple branches (435) are turned on, their current is summed at the output node. The branch enabling switches, i.e., the NFETS (437), then select the combination of output currents to combine onto the output node. For example if the switches, i.e. NFETS (437), for the 2×, 16×, and 128× branches (435-1, 435-4, 435-7) were on (and all others switches were off), a total of 146× the input current (433) would appear at the output node of the MDAC (432). Note that the various combinations of on and off switches support output currents ranging from 0 to 255× the input current (433) with 1× increments. In this fashion, the MDAC (432) multiplies the digital input word (which controls the output branch switches) with the input current (433).

Note that the MDAC (432) of FIG. 4B outputs a sourced current. That is current flows out of the output node. When negative current output is desired, such as when computing −bd, the sourced output current can be fed into a current mirror that's output sinks current. That is, the current flows into the mirrors output node. This current mirror's sinking output is connected to the downstream real summation device (224) subtracting input. Alternatively, this current mirror, or equivalent circuit, can be incorporated into the real summation device (224) and the MDAC (432) shown in FIG. 4B can be used without an additional current mirror.

Figure 5:
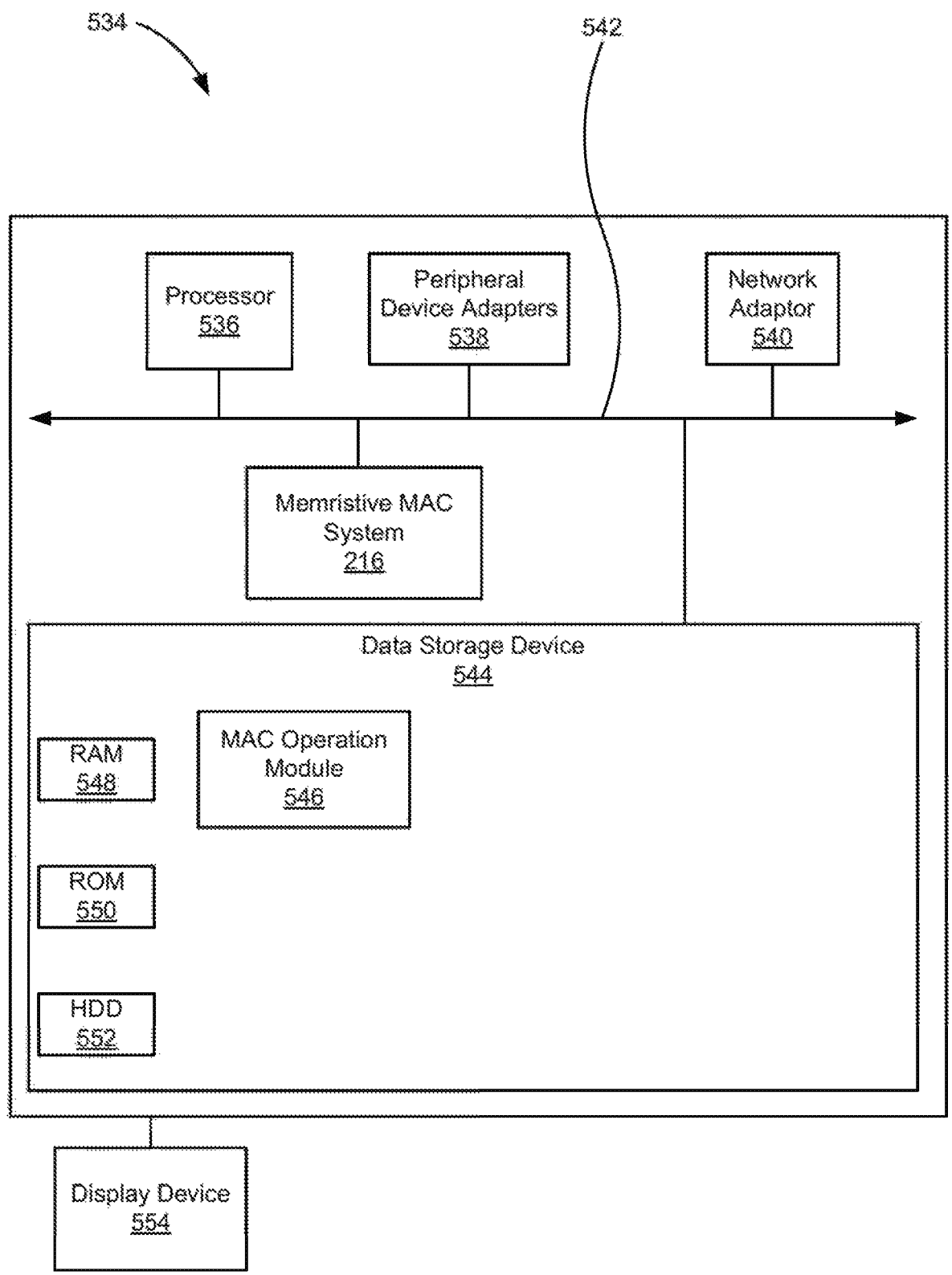
FIG. 5 is a diagram of a computing device that uses a system for performing complex multiply-accumulate operations, according to one example of the principles described herein.

FIG. 5 is a diagram of a computing device (534) that uses a system for performing complex multiply-accumulate operations, according to one example of the principles described herein. The computing device (534) may be implemented in an electronic device. Examples of electronic devices include servers, desktop computers, laptop computers, personal digital assistants (PDAs), mobile devices, smartphones, gaming systems, and tablets, among other electronic devices.

The computing device (534) may be utilized in any data processing scenario including, stand-alone hardware, mobile applications, through a computing network, or combinations thereof. Further, the computing device (534) may be used in a computing network, a public cloud network, a private cloud network, a hybrid cloud network, other forms of networks, or combinations thereof. In one example, the methods provided by the computing device (534) are provided as a service over a network by, for example, a third party.

To achieve its desired functionality, the computing device (534) includes various hardware components. Among these hardware components may be a number of processors (536), a number of data storage devices (544), a number of peripheral device adapters (538), and a number of network adapters (540). These hardware components may be interconnected through the use of a number of busses and/or network connections. In one example, the processor (536), data storage device (544), peripheral device adapters (538), and a network adapter (540) may be communicatively coupled via a bus (542).

The processor (536) may include the hardware architecture to retrieve executable code from the data storage device (544) and execute the executable code. The executable code may, when executed by the processor (536), cause the processor (536) to implement at least the functionality of performing a complex MAC operation. The functionality of the computing device (534) is in accordance to the methods of the present specification described herein. In the course of executing code, the processor (536) may receive input from and provide output to a number of the remaining hardware units.

The data storage device (544) may store data such as executable program code that is executed by the processor (536) or other processing device. As will be discussed, the data storage device (544) may specifically store computer code representing a number of applications that the processor (536) executes to implement at least the functionality described herein.

The data storage device (544) may include various types of memory modules, including volatile and nonvolatile memory. For example, the data storage device (544) of the present example includes Random Access Memory (RAM) (548), Read Only Memory (ROM) (550), and Hard Disk Drive (HDD) memory (552). Many other types of memory may also be utilized, and the present specification contemplates the use of many varying type(s) of memory in the data storage device (544) as may suit a particular application of the principles described herein. In certain examples, different types of memory in the data storage device (544) may be used for different data storage needs. For example, in certain examples the processor (536) may boot from Read Only Memory (ROM) (550), maintain nonvolatile storage in the Hard Disk Drive (HDD) memory (552), and execute program code stored in Random Access Memory (RAM) (548).

The data storage device (544) may include a computer readable medium, a computer readable storage medium, or a non-transitory computer readable medium, among others. For example, the data storage device (544) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (538, 540) in the computing device (534) enable the processor (536) to interface with various other hardware elements, external and internal to the computing device (534). For example, the peripheral device adapters (538) may provide an interface to input/output devices, such as, for example, display device (554), a mouse, or a keyboard. The peripheral device adapters (538) may also provide access to other external devices such as an external storage device, a number of network devices such as, for example, servers, switches, and routers, client devices, other types of computing devices, and combinations thereof.

The display device (544) may be provided to allow a user of the computing device (534) to interact with and implement the functionality of the computing device (534). The peripheral device adapters (538) may also create an interface between the processor (536) and the display device (554), a printer, or other media output devices. The network adapter (540) may provide an interface to other computing devices within, for example, a network, thereby enabling the transmission of data between the computing device (534) and other devices located within the network.

The computing device (534) may, when executed by the processor (536), display the number of graphical user interfaces (GUIs) on the display device (554) associated with the executable program code representing the number of applications stored on the data storage device (544). The GUIs may display, for example, interactive screenshots that allow a user to interact with the computing device (534) to input values in association with the memristive MAS system (216) as will be described in more detail below. Additionally, via making a number of interactive gestures on the GUIs of the display device (554), a user may obtain a dot product value based on the input data. Examples of display devices (554) include a computer screen, a laptop screen, a mobile device screen, a personal digital assistant (PDA) screen, and a tablet screen, among other display devices (554).

The computing device (534) may further include a memristive MAC system (216) that has memristive cells (FIG. 1, 102) with multiple input multipliers (FIG. 1, 104, 106).

The computing device (534) further includes a number of modules used in the implementation of the systems and methods described herein. The various modules within the computing device (534) include executable program code that may be executed separately. In this example, the various modules may be stored as separate computer program products. In another example, the various modules within the computing device (534) may be combined within a number of computer program products; each computer program product including a number of the modules.

The computing device (534) may include a MAC operation module (546) to, when executed by the processor (536), assist in the functionality of the complex memristive MAC system (216). The MAC operation module (546), for example, is used to determine the input voltages applied to the row lines of the array.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (536) of the computing system or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

Using single memristive devices to represent real and imaginary components of a complex weight and using real input multipliers and imaginary input multipliers 1) allows for a single memristive device to store the value of each element of the complex weights and 2) performs sub-computations of complex multiplication simultaneously thus increasing efficiency of complex MAC operations. However, it is contemplated that the devices disclosed herein may provide useful in addressing other matters and deficiencies in a number of technical areas. Therefore the systems and methods disclosed herein should not be construed as addressing any of the particular matters.

The preceding description has been presented to illustrate and describe examples of the principles described. This description is not intended to be exhaustive or to limit these principles to any precise form disclosed. Many modifications and variations are possible in light of the above teaching.

What is claimed is:

1. A memristive multiplication device comprising:
at least two memristive cells, each memristive cell comprising:
a memristive element to store one component of a complex weight value;
a real input multiplier coupled to the memristive element to multiply an output signal of the memristive element with a real component of an input signal; and
an imaginary input multiplier coupled to the memristive element to multiply the output signal of the memristive element with an imaginary component of the input signal,
wherein the at least two memristive cells comprise:
a first memristive element in a first memristive cell, the first memristive element to indicate a real component of the complex weight value, wherein an output signal of the first memristive element is a current indicative of the real component of the complex weight value; and
a second memristive element in a second memristive cell, the second memristive element to indicate an imaginary component of the complex weight value, wherein an output signal of the second memristive element is a current indicative of the imaginary component of the complex weight value.

2. The device of claim 1, wherein each memristive cell includes a multi-output current mirror to duplicate the output of the memristive element to both the real input multiplier and the imaginary component multiplier.

3. The device of claim 1, wherein a multiplier includes a multi-output current mirror.

4. The device of claim 3, wherein the multi-output current mirror facilitates generation of scaled versions of the output signal of the memristive element.

5. A method for performing a complex multiply-accumulate operation comprising:
applying a first voltage representing a real component of an input signal and a second voltage representing an imaginary component of the input signal to a first real input multiplier and a first imaginary input multiplier, respectively, of a first memristive cell;
applying the first voltage and the second voltage to a second real input multiplier and a second imaginary input multiplier, respectively, of a second memristive cell;
applying a current representing a real component of a complex weight input to the first real input multiplier and the first imaginary input multiplier of the first memristive cell;
applying a current representing an imaginary component of a complex weight input to the second real input multiplier and the second imaginary input multiplier of the second memristive cell;
summing outputs of the multipliers that include real components; and
summing outputs of the multipliers that include imaginary components, which summations represent a multiply-accumulate operation of a complex input and complex weight values.

6. The method of claim 5, wherein the first voltage and second voltage are representative of a complex input value of a complex input vector, each complex input value being passed to a different multiplication device.

7. The method of claim 5, further comprising:
duplicating the current representing the real component such that an instance of the current representing the real component is passed to each of the real input multiplier and the imaginary input multiplier of the first memristive cell; and
duplicating the current representing the imaginary component such that an instance of the current representing the imaginary component is passed to each of the real input multiplier and the imaginary input multiplier of the second memristive cell.

8. The method of claim 5, further comprising applying a third voltage to the memristive elements to set the state of the memristive element to represent a component of a complex weight value.

9. A memristive array comprising:
multiple memristive multiplication devices, each memristive multiplication device comprising:
a first memristive cell comprising a memristive element to store a real component of a complex weight value;
a second memristive cell comprising a memristive element to store an imaginary component of the complex weight value;
wherein each memristive cell comprises:
a real input multiplier coupled to the memristive element to:
receive an output signal of the memristive element;
receive a real component of an input signal; and
output a signal defining a multiplication of the output signal with the real component; and
an imaginary input multiplier coupled to the memristive element to:
receive an output signal of the memristive element;
receive an imaginary component of an input signal; and
output a signal defining a multiplication of the output signal with the imaginary component; and
a real summation device to sum outputs of multipliers that have real components; and
a real summation device to sum outputs of multipliers that have real components.

10. The array of claim 9, further comprising:
a first analog-to-digital converter to convert an output of the real summation device into a digital signal; and
a second analog-to-digital converter to convert an output of the imaginary summation device into a digital signal.

11. The array of claim 9, wherein the real summation device sums the outputs of multiple memristive multiplication devices.

12. The array of claim 11, wherein the real summation device outputs a single output.

13. The array of claim 9, wherein the imaginary summation device sums the outputs of multiple memristive multiplication devices.

14. The array of claim 13, wherein the imaginary summation device outputs a single output.

* * * * *